United States Patent [19]

Davidsohn, deceased et al.

[11] 3,847,687

[45] Nov. 12, 1974

[54] METHODS OF FORMING SELF ALIGNED TRANSISTOR STRUCTURE HAVING POLYCRYSTALLINE CONTACTS

[75] Inventors: Uryon S. Davidsohn, deceased, late of Phoenix, Ariz.; Amil J. Ajamie, administrator, Phoenix, Ariz.

[73] Assignee: Motorola, Inc., Franklin Park, Ill.

[22] Filed: Nov. 15, 1972

[21] Appl. No.: 306,762

[52] U.S. Cl. .................. 148/187, 148/189, 148/175, 317/235 R

[51] Int. Cl. .................................................. H01l 7/44

[58] Field of Search ....... 148/187, 175; 317/235 AT

[56] References Cited

UNITED STATES PATENTS

| | | | |
|---|---|---|---|
| 3,719,535 | 3/1973 | Zoroglu | 148/187 |
| 3,717,514 | 2/1973 | Burgess | 148/175 |
| 3,648,128 | 3/1972 | Kobayashi | 317/235 F |
| 3,659,160 | 4/1972 | Sloan et al. | 148/175 X |

*Primary Examiner*—G. T. Ozaki
*Attorney, Agent, or Firm*—Vincent J. Rauner; Willis E. Higgins

[57] ABSTRACT

Disclosed are three processes, which all employ a common sequence of steps, for forming discrete and integrtated circuit transistors having emitters self-aligned between base enhancements and various polycrystalline silicon contacting members. The first process forms transistors having polycrystalline emitter contacts. The second process employs anisotropic etching techniques for forming self-aligned, integrated circuit transistors having polycrystalline emitter and collector contacts along with shallow isolation and collector buried layer contacting diffusions. The third process provides a transistor having polycrystalline silicon contacts to the emitter and base enhancement regions and utilizes boron doped polycrystalline silicon base contacts as an etch stop.

12 Claims, 26 Drawing Figures

METHODS OF FORMING SELF ALIGNED TRANSISTOR STRUCTURE HAVING POLYCRYSTALLINE CONTACTS

CROSS-REFERENCE TO RELATED APPLICATION

The present application has subject matter related to the subject matter of the application by Ronald R. Burgess, "Polycrystalline Elements for Integrated Circuits," filed on Oct. 6, 1970, Ser. No. 78,495, now abandoned, and which is assigned to the same assignee as the subject application.

BACKGROUND OF THE INVENTION

Some of the most important characteristics of a transistor relate to its current and power gains as a function of frequency. To provide a transistor having maximum high frequency current gain, it is necessary to adapt the geometry and materials thereof so that they cooperate to maximize the current gain bandwidth. The current gain bandwidth is inversely proportional to the individual time delays associated with the emitter, base and collector structures. Hence, each of these delays must be minimized by careful design of all of these structures, and the emitter and base structures in particular. More specifically, it is known that the emitter delay time is reduced through decreasing the emitter transition capacitance by providing a small active emitter area. Moreover, since it is also known that the base delay time is directly proportional to the square of the basewidth, small basewidths are also desired. Thus, by fabricating a transistor to have a small emitter area and a shallow or narrow base, its current gain is maximized at high frequencies.

If it is also desired to maximize the power gain bandwidth, in addition to maximizing the current gain bandwidth, the collector capacitance and the base resistance must be minimized. The collector capacitance is minimized by providing a small active collector-to-base junction area and the base resistance is partly minimized by forming a shallow base having a high concentration of impurity. Since, as a practical matter, it is difficult to diffuse a shallow base having a low resistance, enhancement diffusions are often employed to reduce the base resistance.

The base resistance is further minimized by carefully selecting the transistor emitter-base geometry to take advantage of conductivity-modulation and base region self crowding. Conductivity-modulation relates to a decrease in the base resistance in that portion of the base which surrounds the emitter and which has a conductivity that increases with increase in emitter and collector currents. Base region self crowding results from the voltage drop in the base region caused by the base current flow therethrough to the base contact. This voltage increases with distance from the base contact. The effect of this internal base voltage is to reduce the applied forward bias at those portions of the emitter-to-base junction located farthest from the base contact to thereby cause a reduction of the active cross sectional area of the emitter.

The effects of conductivity-modulation and base region self crowding are taken into consideration by assuming that only the periphery of the emitter is active. This assumption is particularly true for very small area, high frequency transistors. Since this leaves the portion of the base between the emitter edge and the base contact as the most important segment affecting the base resistance, the length of this portion ought to be as short as possible. Because it is desired to have long emitter perimeters to increase current density capability and small emitter areas to optimize the current and power gain bandwidths, thin rectangular stripes are the natural choice for the emitter geometry. Furthermore, base contacts having the same rectangular geometry and spaced as close as possible to the emitter stripes are also desired.

The above theoretical considerations are difficult to implement because of the mechanical and chemical tolerances involved in the standard photolithographic techniques and reagents utilized in fabricating discrete and integrated circuit transistors. More particularly, although the theory provides that the collector ought to be small, as a practical matter it usually must be large enough to include a base structure having enhancement diffusions therein with an emitter structure located between the enhancement diffusions. The masks used in forming these structures, which are themselves formed by drafting and photographic processes, have mechanical tolerances associated with them. Moreover, the manual alignments of some of these masks with respect to patterns previously formed in the wafer also have tolerances. These tolerances and the difficulty of aligning within small rectangular base geometries, even smaller rectangular emitter geometries create limitations on the minimum area of transistor junctions, the minimum base width and how close contacts can be placed to each other to thereby reduce the high frequency characteristics more than what is necessary in view of countervailing electrical considerations such as collector current specifications.

To overcome some of the above alignment problems, one prior art method teaches the employment of a very thin silicon dioxide layer over the diffused emitter region as an etchant mask during the etching of the base contact apertures. After the base aperture is established, the thin silicon dioxide layer over the emitter is "washed out" to automatically re-establish the emitter aperture. Hence, this process avoids the alignment of an emitter mask within the base for establishing a passivated, pre-ohmic emitter aperture. A metallization layer is then formed over the passivation layers and apertures of the prior art device. Next, portions of the metallization layer are removed leaving a desired pattern providing conductive paths to each of the emitter, base and collector structures.

Such prior art "self-aligning" techniques are not without problems. Since shallow junction devices have small lateral emitter diffusions, complications may arise because of possible undercutting of the surface passivation oxide and the resulting undesired exposure of a portion of the emitter-to-base junction during the "wash out." Formation of the metallization layer may then provide metal across this exposed junction portion causing an emitter-to-base short and ultimate rejection of the device. Moreover, some metals used for metallization attack the surface oxide and penetrate the small amount required to reach the base-to-emitter junction even if the passivation is not injured.

Also, high concentration diffusions, such as those utilized to form an emitter, cause distortion of and damage the crystalline lattice along with the effect known as "push ahead" whereby the base diffusion profile is distorted. To help overcome some of the above problems, the process described in the aforementioned related application utilizes a polycrystalline silicon layer through which the emitter is diffused and to isolate the transistor junctions from the metallization. However, the prior art process of the related application does not provide for either self-alignment of an emitter structure within the base region or the combination of polycrystalline silicon emitter and base contacts to enable greater spacing of the base and emitter metallization to facilitate less critical alignments. Also, this process is not readily combinable with process steps utilized to form junction isolation and buried layer contacting diffusions for integrated circuit transistors.

SUMMARY OF THE INVENTION

One object of this invention is to provide an improved method by which either discrete or integrated circuit transistors having maximized power gain-bandwidths can be fabricated.

Another object of this invention is to provide a process which facilitates the manufacture of discrete and integrated circuit transistors having reduced junction areas, shallow bases having low base resistances, and emitters having large perimeter-to-area ratios.

Still another object of this invention is to provide a method of manufacture for transistors having an emitter structure which is self-aligned between base enhancement regions.

A further object of this invention is to provide a method of manufacturing transistors suitable for amplifying high frequency signals which requires relatively few, non-critical mask alignments as compared to prior art processes.

A still further object of this invention is to provide a method of manufacturing minimum size transistors having rectangular geometries for amplifying high frequency signals and which provides emitter, base and collector polycrystalline silicon contacts to enable metallization running to the emitter, base and collector areas to be spaced farther apart to thereby require less critical metallization masks and alignments than have previously been required for making prior art devices having rectangular geometries of minimum size.

An additional object of the invention is to provide a method of manufacturing a transistor structure suitable for amplifying high frequencies having an emitter contact formed from polycrystalline silicon which has an area that is larger than the emitter to facilitate alignment of an emitter metallization mask thereon and which contact is self-aligned with the emitter and located between base enhancement diffusions.

A still additional object of the invention is to provide a process of manufacture for integrated circuit transistors having shallow isolation and collector buried layer contacting diffusions which are reapectively formed by the base enhancement and the emitter diffusions.

The process of the invention forms either discrete or integrated circuit transistors having emitters self-aligned between base enhancements and having various polycrystalline silicon contacting members. More specifically, the following process of the invention forms a polycrystalline silicon emitter contact and an emitter region in a semiconductor material already having a base and a collector formed therein. A first mask is provided on the base having openings therein which expose selected areas of the base through which the enhancement and emitter diffusants are to enter. Next, a contacting material such as polycrystalline silicon, is provided in at least the emitter opening of the first mask. A second mask is then formed on the contacting material overlying the emitter opening. Enhancement regions are then diffused into the areas of the base exposed by the enhancement openings of the first mask. The enhancement openings of the first mask are then closed and the second mask is removed from over the emitter opening. The emitter is then diffused through the contacting material and into the base to form the emitter and the emitter contact.

Modifications of the above process, such as employing silicon having a [100] crystallographic orientation and a potassium hydroxide anisotropic etch, facilitate the formation of integrated circuit transistors having shallow isolation and collector buried layer contacting diffusions and emitter and collector contacts. Moreover, closely spaced polycrystalline silicon emitter and base contacts are provided by boron doping selected portions of a polycrystalline silicon layer to a predetermined concentration wherein they act as etch stops to facilitate selective removal of undoped portions.

DETAILED DESCRIPTIONS OF THE PREFERRED EMBODIMENTS

Figure 1:
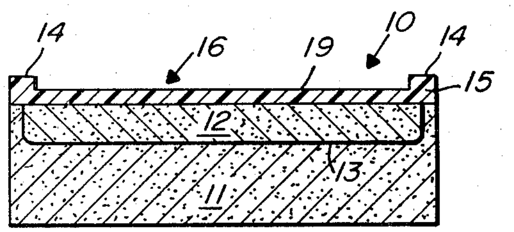
FIGS. 1 through 12 illustrate structures formed at various stages of one process of the invention whereby a transistor is formed having a polycrystalline silicon emitter contact, and base enhancement and emitter regions which are all automatically self-aligned with each other.

FIGS. 1 through 12 of the drawing depict semiconductor structures formed at each of various stages of a process of the invention forming a discrete transistor which has high power and current-gain-bandwidths. More specifically, the disclosed process facilitates the manufacture of discrete transistors comprised of minute emitter, base and collector junctions, bases having narrow widths and low resistances, and emitters having high perimeter-to-area ratios.

FIG. 1 is a cross-sectional view of silicon material 10 including collector 11 having a shallow base 12, of a depth on the order of 0.5 microns and a rectangular cross-section area of 0.35 thousandths of an inch (mil) by about 4 mils, diffused therein to form base-to-collector junction 13. Relatively thick silicon dioxide portions 14 of layer 15, having thicknesses on the order of 5,000 angstroms (A) indicate the cross section of the base diffusion mask and relatively thinner portion 16 of silicon dioxide layer 15 indicates the thin layer which formed in the opening between portions 14 as base 12 was diffused. Generally, the structure of FIG. 1 and processes for forming it are known in the prior art. However, the subject invention enables base 12 to have a small geometry relative to prior art devices.

Figure 2:
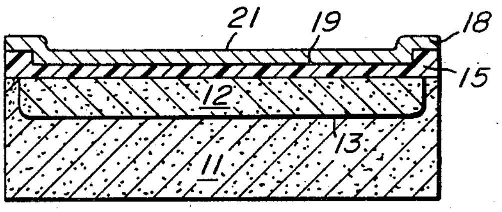
Figure 3:
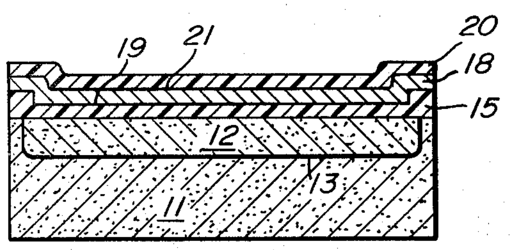

As shown in FIG. 2, a layer of silicon nitride 18 is next formed over base 12 and on exposed surface 19 of silicon dioxide layer 15. This nitride layer, which has a thickness on the order of 1,000 angstroms, is relatively thick as compared to a silicon nitride layer to be subsequently described and ultimately is formed into a mask for underlying silicon dioxide layer 15. Another silicon dioxide layer 20 is then formed on the top surface 21 of silicon nitride layer 18, as shown in FIG. 3.

Figure 4:
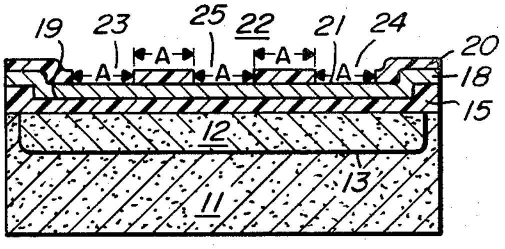

Known photolithographic and etch techniques are utilized to provide an etch pattern 22 in silicon dioxide layer 20 which selectively exposes portions of surface 21 of silicon nitride layer 18, as shown in FIG. 4. Pattern 22 is necessary because silicon nitride layer 18 can not be patterned directly by known photoresist techniques. As also indicated in FIG. 4, the etchant, which may be hydrofluoric acid, that removes the selected portions of silicon dioxide layer 20 to form pattern 22 does not attack silicon nitride layer 18. Hence, silicon nitride layer 18 forms an etch stop for the silicon dioxide etchant in this and subsequent steps.

Outside openings 23 and 24 of silicon dioxide pattern 22 overlie the base areas through which base enhancement regions will eventually be diffused and center opening 25 of pattern 22 overlies the base area through which the emitter will eventually be diffused. Since these patterns are simultaneously cut, the emitter is automatically self-aligned between the base enhancement areas by the alignment of the single mask which provides pattern 22. Moreover, this mask alignment is not critical because there is little, if any, impairment of the electrical characteristics of the resulting transistor if the base enhancement happens to overlap base-to-collector junction 13 and thereby redefine the junction configuration. The distances, A of FIG. 4 across openings 23 and 24 for the base enhancement and across opening 25 for the emitter diffusion can be of the minimum length presently obtainable by known photolighographic techniques, which at present, is on the order of 0.05 mils. Furthermore, the silicon dioxide islands located between the base and emitter openings also have distances, A across them on the order of 0.05 mils. Hence, mask 22 facilitates the fabrication of rectangular emitter and base regions having the minimum geometry presently obtainable to facilitate maximization of the current and power gain bandwidths of the final transistor structure.

Figure 5:
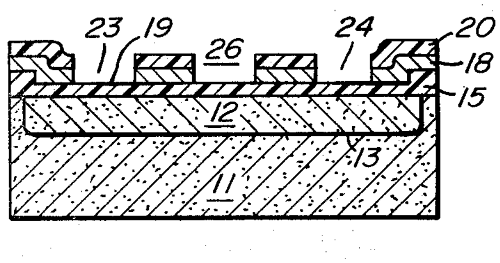

The structure shown in FIG. 4 is then subjected to a nitride dip etch, which may be comprised of hot phoshoric acid, to remove only the portions of silicon nitride layer 18 under the surface areas thereof exposed by silicon dioxide pattern 22 to form pattern 26 of FIG. 5. As a result, underlying areas of top surface 19 of first silicon dioxide layer 15 are exposed by silicon nitride pattern 26 to form the structure illustrated in FIG. 5. The nitride etch does not attack silicon dioxide layer 15, which acts as an etch stop therefor.

Figure 6:
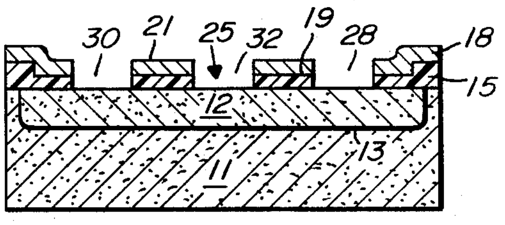

A silicon dioxide dip etch is then performed to remove portions of silicon dioxide layer 15 underlying the exposed areas thereof, to thereby form silicon dioxide pattern 25 which reveals corresponding areas on the top surface of base 12, as shown in FIG. 6. Moreover, the foregoing silicon dioxide dip etch also removes either part or all of thin silicon dioxide pattern 22. Assuming complete removal of pattern 22, silicon nitride surface 21 is thereby exposed as illustrated in FIG. 6.

Figure 7:
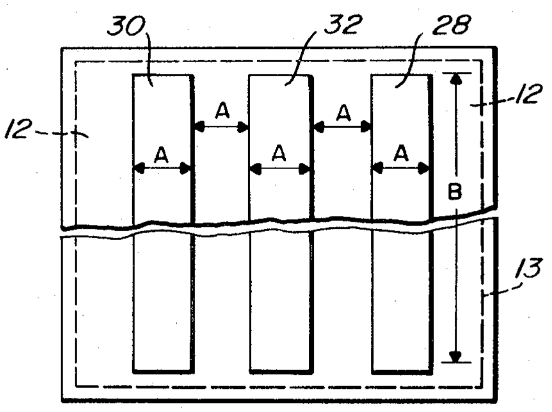

FIG. 7 depicts a top or plan view of the structure of FIG. 6 and illustrates rectangular base enhancement openings 28 and 30 and rectangular emitter opening 32, which have transverse dimensions A on the order of 0.05 mil and longitudinal dimensions B on the order of 4 mils. The longitudinal lines of FIG. 7, extending along dimension B are shown as broken to indicate that the structure extends farther in the longitudinal direction to thereby facilitate the formation of a rectangular emitter having a large perimeter-to-area ratio to facilitate the reduction of the base resistance by taking advantage of conductivity modulation and base region self crowding phenomena. Moreover, as is known, the longitudinal dimension, B of openings 28, 30 and 32 of FIG. 7 may be increased or reduced to facilitate the fabrication of a transistor to meet a particular collector current specification. Also, the basic structure shown in FIGS. 6 and 7 may be reiterated to form a plurality of individual emitter and base enhancement openings for a corresponding plurality of bases through which a plurality of emitters and base enhancement regions are eventually diffused. Individual base enhancements and emitters are then connected in parallel to form a composite high frequency, high power transistor. Although rectangular emitter and base openings are shown, other configurations having high perimeter to area ratios may be utilized.

Figure 8:
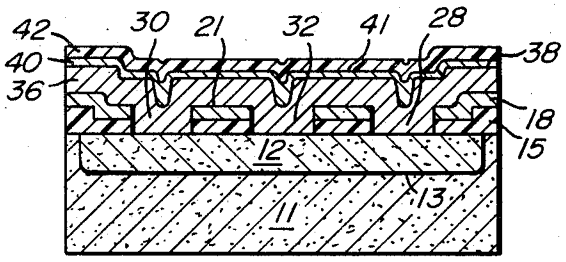

As shown in FIG. 8, polycrystalline silicon layer 36, which has a thickness on the order of 2,000 A is deposited on the exposed surface of nitride layer 21 and on the exposed portions of base 12. Portions of polycrystalline silicon layer 36 extend into base enhancement openings 28 and 30 and into emitter opening 32, as shown. Next, thin layer of silicon nitride 40, which has a thickness on the order of 500 A and is thus thinner than layer 18, is next deposited on top surface 38 of polycrystalline silicon layer 36. Silicon dioxide layer 42, which has a thickness on the order of 2,000 A and is thus thinner than layer 15, is then provided on top surface 41 of thin silicon nitride layer 40.

Figure 9:
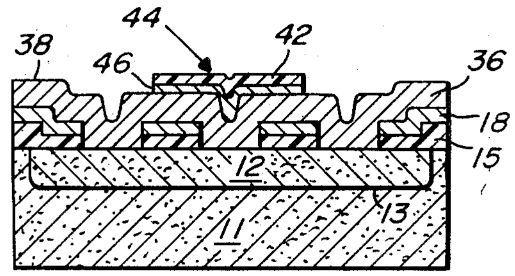

A mask which has a relatively large aperture therein as compared to emitter opening 32 is aligned on top of silicon dioxide layer 42 so that the aperture enables exposure of photoresist which overlies emitter opening 32. This mask and its alignment is less critical than a conventional emitter mask and alignment utilized to position the emitter between base enhancements to form a prior art transistor having the same small dimensions. Subsequent photoresist and etch techniques are utilized to selectively remove portions of silicon dioxide layer 42 to leave pattern 44 as shown in FIG. 9. Silicon nitride layer 40 forms an etch stop for the etchant operating on silicon dioxide layer 42. Next, silicon dioxide pattern 44 is utilized to provide an etch mask to facilitate a dip etch which selectively removes portions of thin silicon layer 40 to form silicon nitride pattern 46, shown in FIG. 9, and to selectively expose areas of top surface 38 of polycrystalline silicon layer 36.

Figure 10:
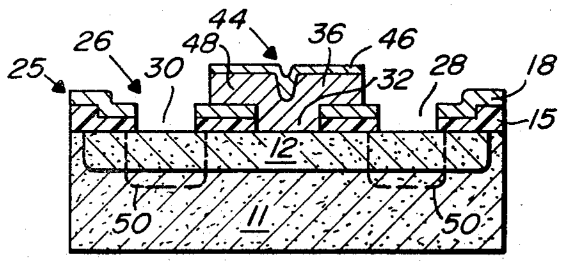

Silicon dioxide pattern 44 and silicon nitride pattern 46 cooperate to form an etch mask for polycrystalline layer 36 to facilitate its removal from base enhancement openings 28 and 30 and to shape it into emitter cap or contact configuration 48, shown in FIG. 10, which covers and fills emitter opening 32. Moreover, a silicon dioxide dip etch is then utilized to remove thin silicon dioxide pattern 44 from over polycrystalline silicon contact 48 to expose nitride pattern 46, as also shown in FIG. 10. Thick silicon nitride layer 18 protects underlying silicon dioxide layer 15 during this silicon dioxide etch.

Next, a base enhancement diffusion is performed through openings 28 and 30 which changes the impurity profile of the base by providing enhanced regions 50 of the structure shown in FIG. 10 which have increased doping of the same conductivity type as compared to the rest of base 12. Nitride pattern 26 prevents the enhancement from entering the silicon except through the enhancement openings. Enhanced regions 50 provide a high conductivity path between the base metallization, to be subsequently applied, and the active portions of the base region to thereby facilitate a low base resistance. Moreover, such regions facilitate the formation of a good ohmic contact rather than a rectifying contact between aluminum metallization and a base formed by a relatively low concentration N-type diffusion. However, diffused or enhanced regions 50 lower the base resistance regardless of the type of impurity utilized to form the base. Emitters do not usually require an enhancement diffusion regardless of impurity type because of their already high concentration. Thin layers of silicon dioxide 52 are formed in and close the enhancement openings 29 and 30 as either a by-product of or after the enhancement diffusion.

Another silicon nitride dip etch is utilized to remove silicon nitride layer 46 to thereby expose the top surface of polycrystalline silicon member 48. Since silicon nitride layer 18 is substantially thicker than silicon layer 46, the dip etch can be designed to completely remove layer 46 while not removing silicon nitride pattern 23. However, pattern 25 provided in silicon dioxide layer 15 protects the underlying silicon during the foregoing nitride etch even if silicon nitride layer 18 is removed. Silicon dioxide layer 20, as shown in FIG. 5, could also be employed to protect silicon nitride layer 18 during the removal of silicon nitride layer 46 if silicon dioxide layer 20 is made thick enough to not be removed during the patterning of silicon dioxide layer 15, as previously described with respect to FIGS. 5 and 6.

Figure 11:
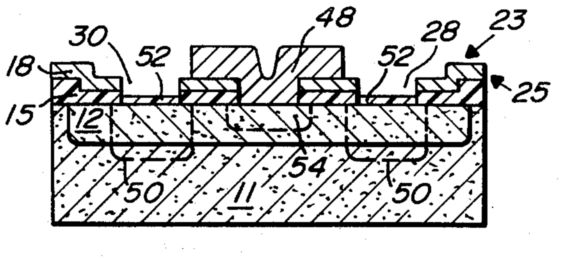
Figure 12:
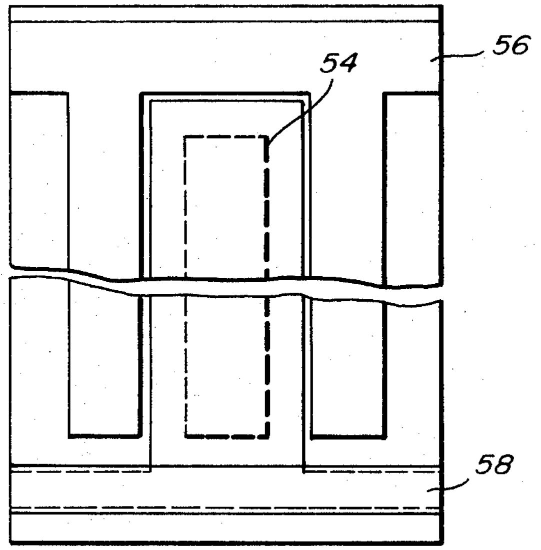

A shallow emitter region 54 of FIG. 11 having a depth on the order of 2,000 angstroms, a width on the order of 0.05 mils and a length on the order of 4 mils is then diffused directly through polycrystalline silicon emitter cap or contact 48. Silicon dioxide mask 25 prevents the emitter diffusion from entering the silicon except through the emitter opening. Polycrystalline silicon emitter contact 48 provides many useful functions in addition to providing a larger "target area" on which the emitter metallization masks can be aligned. More specifically, contact 48 getters metallic impurities from the region of the emitter-to-base junction to reduce recombination and improve the beta of the transistor. Moreover, any diffusion induced dislocations such as might be associated with the high impurity emitter concentrations are caused in the polycrystalline silicon rather than in the monocrystalline emitter to thereby reduce noise figures and leakage currents. Furthermore, polycrystalline silicon layer 48 minimizes the possibility of perturbation by ionized contaminants which may be introduced during post emitter diffusion processes such as pre-ohmic, photoresist, metallization, metal etch, etc.

A pre-ohmic etch is then performed to reopen enhancement openings 28 and 30 and uncover the emitter contact cap 48. A thin layer of metal is then applied and patterned by known techniques to provide base metallization 56 of FIG. 12 which forms a conductive connection to base enhancement regions 50, and emitter metallization 58 which forms a conductive connection to heavily doped polycrystalline silicon emitter cap 48. By using the foregoing process, a plurality of interdigitated emitter and base regions can be formed and connected in parallel to form a high frequency, high power discrete transistor chip which is included in an appropriate housing that facilitates electrical connection and provides protection therefor.

The above described process of the invention can also be utilized to form self-aligned base enhancement and emitter diffusions for integrated circuit transistors having polycrystalline silicon emitter contacts. One method by which this can be accomplished is to provide a standard integrated circuit starting material having a substrate which is provided with a buried layer having an epitaxial layer formed thereon. Next, deep isolation, deep collector buried layer contact and base diffusions are provided through the epitaxial layer in a conventional manner. Then the above steps for forming a discrete transistor can be employed to provide the self-aligned emitter contact, emitter diffusion and base enhancement diffusions. While this process is suitable for manufacturing integrated circuit transistors for some devices, the deep isolation and collector buried layer contacting diffusions have an undesirable tendency to out diffuse during subsequent processing steps.

Alternatively, also in accordance with the invention, an integrated circuit transistor having self-aligned emitter and base enhancement diffusions, a junction isolation diffusion, collector buried layer contacting diffusion, and polycrystalline silicon conductors to the emitter and to the collector buried layer contacting diffusion can be formed by employing the above described process for forming a discrete transistor in combination with other steps. This alternative process, which is described in greater detail below, does not require deep isolation and deep buried layer contacting diffusions.

Figure 13:
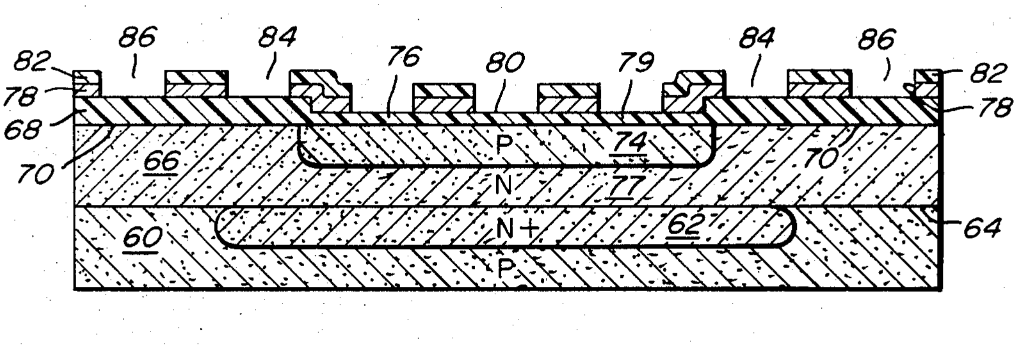
FIGS. 13 through 18 illustrate structures formed at various stages of a process forming an integrated circuit transistor having shallow isolation and collector buried layer contacting diffusions, emitter and collector contacts, and an emitter and base enhancement regions which are all automatically self-aligned with each other.

More specifically, FIG. 13 illustrates a cross-sectional view of an integrated circuit structure comprised of P-doped substrate 60 including an N+ buried layer 62 formed by diffusion through surface 64 of the substrate. Substrate 60 is formed to have a [100] crystallographic orientation so that N-type epitaxial layer 66 formed thereon also has a [100] crystallographic orientation. Silicon dioxide layer 68 is then formed on surface 70 of epitaxial layer 66 and a pattern is formed therein having an opening through which P-type base 74 is diffused and thin silicon dioxide layer 76 is formed as a by-product of the diffusion. As a consequence region 77 becomes the collector structure. Next, silicon nitride layer 78 is provided on top surface 80 of silicon dioxide layer 79 which is formed by integral silicon dioxide portions 68 and 76. Subsequently, another silicon dioxide layer 82 is formed on silicon nitride layer 78. Silicon dioxide layer 82 is then masked by known photolighograhic techniques and etched by a silicon dioxide etchant to provide an etch mask for silicon nitride layer 78 which is then etched by a silicon nitride etchant to provide the structure shown in FIG. 13. Hence, the integrated circuit process thus far described and the structure shown in FIG. 13 are similar to the discrete transistor and structure process of FIG. 5, except that the structure of FIG. 13 includes collector buried layer contact openings 84, isolation openings 86 and buried layer 62. The emitter and enhancement openings and intermediate masking portions of FIG. 13 have "minimum line width geometries" on the order of 0.05 mils.

Figure 14:
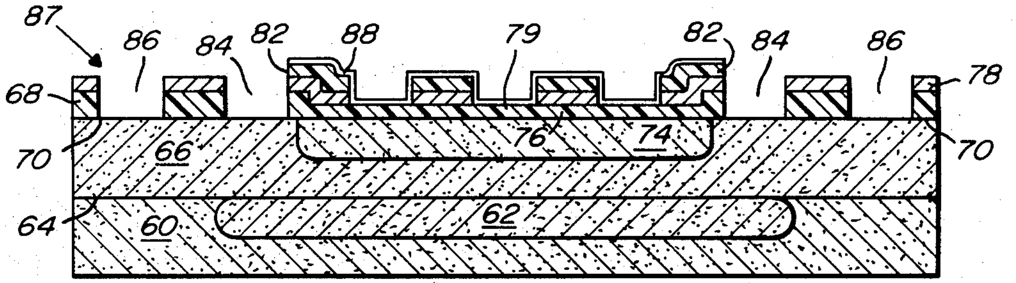

As shown in FIG. 14, an etch resistant mask 88 is then placed over the silicon dioxide layers overlying base 74 by known photolithographic process. The mask alignment required to form layer 88 is relatively non-critical as compared to mask alignments necessary to form an emitter structure of comparable size employed by most prior art processes. Next, a silicon dioxide dip etch removes the exposed portions of silicon dioxide layer 68 from openings 84 and 86 to provide a mask 87 which exposes selected areas of surface 70 of epitaxial layer 66. This dip etch also removes portions of silicon dioxide layer 82 which are not protected by etch resistant layer 88.

Figure 15:
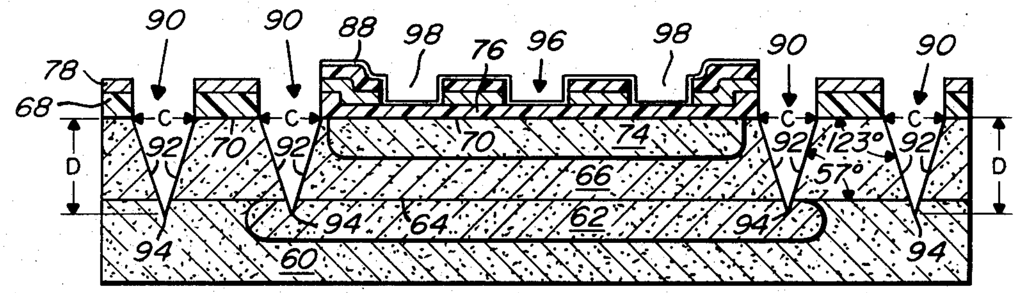

An anisotropic etchant, such as potassium hydroxide (KOH), is applied to the semiconductor structure. This etchant, as is known, responds to the [100] crystallographic orientation of layer 66 to remove silicon material thereby forming grooves 90, as shown in FIG. 15, that have outwardly facing sidewalls 92 each of which forms an included angle with surface 70 on the order of 123°. The etch rate substantially decreases when sidewalls 92 meet to form points 94. Therefore, the dimensions C of mask 87, in the direction parallel to surface 70, are selected in an attempt to control the depths, D of grooves 90 so that they penetrate interface 64 and extend into but do not penetrate through substrate 60. Even if grooves 90 do non penetrate interface 64, the present process still results in an operable device as will be subsequently described.

Figure 16:
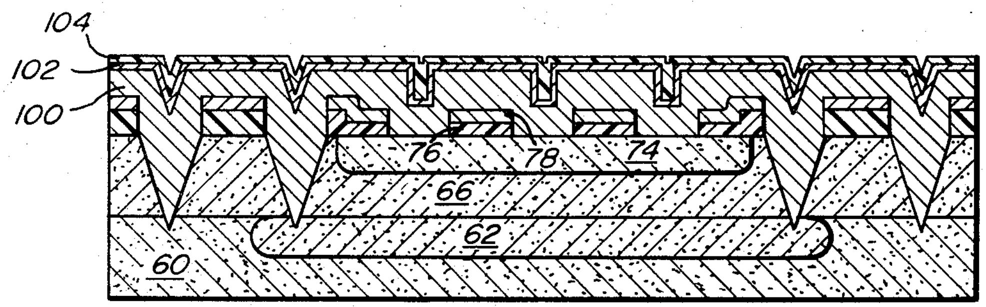
Figure 17:
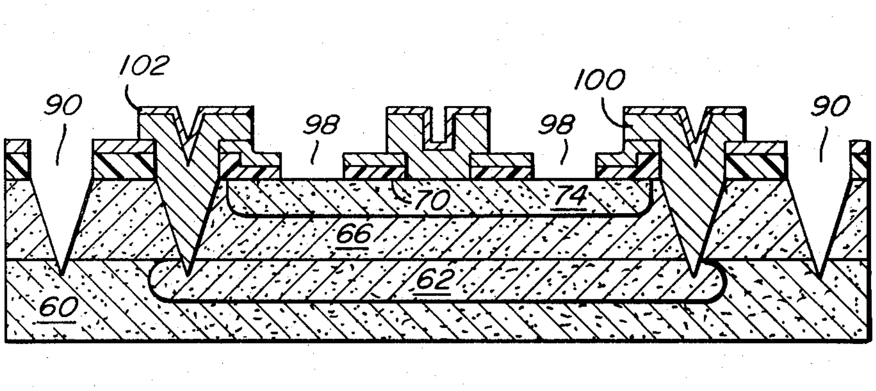

Next, after photoresist mask 88 is removed a silicon dioxide dip etch removes silicon dioxide layer 76 from emitter opening 96, base enhancement openings 98, and from the surface of the structure to expose silicon nitride layer 78. Then, as shown in FIG. 16, a layer of polycrystalline silicon 100 is deposited in grooves 90, in the base enhancement and emitter openings and over the rest of the top surface of nitride layer 78. A thin layer of silicon nitride 102 is then deposited on polycrystalline silicon layer 100. Subsequently, a thin silicon dioxide layer 104 is deposited on silicon nitride layer 102. Portions of silicon dioxide layer 104 are selectively removed by known photolithographic and etch processes to provide a pattern for controlling the selective removal of silicon nitride layer 102 to thereby expose selected underlying areas of the surface of polycrystalline silicon layer 100. After silicon dioxide layer 104 is removed, an etchant is utilized to remove the exposed polycrystalline silicon from isolation grooves 90 and from base enhancement openings 98, as shown in FIG. 17.

Figure 18:
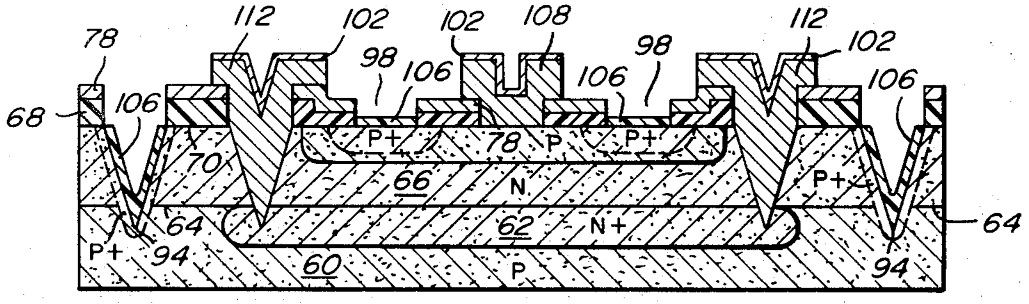
Figure 19:
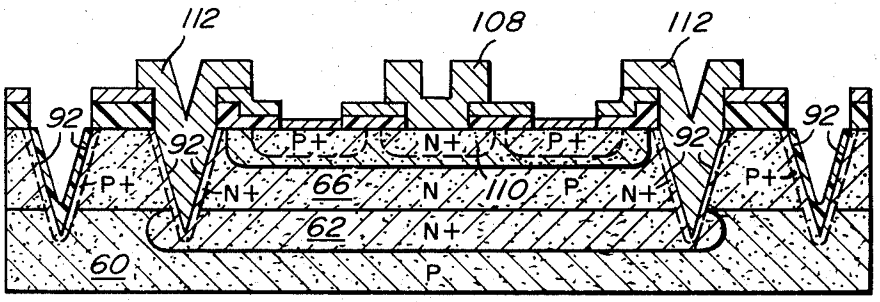
FIGS. 19 through 26, in combination with FIGS. 1 through 8, show structures occurring at various stages of a process providing a transistor having base and emitter contacts, and emitter and base enhancement regions which are all self-aligned with respect to each other.

A P+ diffusion is then performed through the outwardly facing, exposed sidewalls of exposed isolation grooves 90 and through the portions of surface 70 exposed by base enhancements openings 98, as shown in FIG. 18. Silicon dioxide layer 106 forms in these openings as a by-product of this diffusion but not on exposed silicon nitride layer 102. Even if points 94 of isolation grooves 90 do not extend into P-type substrate layer 60, the isolation diffusion probably will extend through interface 64 and into layer 60 to thereby provide junction isolation of the device surrounded by the isolation diffusion.

Next, the structure of FIG. 18 is subjected to a nitride etch which removes nitride layer 102 thereby exposing the polycrystalline silicon emitter and collector contacts. Silicon dioxide layers 68 and 106 cover the rest of the surface so that an N+ emitter diffusion permeates emitter cap 108, overlying the emitter opening to form shallow emitter 110, and collector contacts 112 to form a conductive connection to buried layer 62. In a manner similar to that previously described with respect to the junction isolation diffusions, even if collector grooves 90 do not extend all the way into buried layer 62, the N+ diffusions permeating through the outwardly facing sidewalls 92 thereof probably will make contact between buried layer 62 and the top surface of polycrystalline silicon collector contacts 112.

Hence, what has been described is a method for manufacturing an integrated circuit transistor having shallow diffusions, small geometry and polycrystalline silicon contacts for the collector and emitter. Moreover, the process enables the isolation regions and base enhancement regions to be simultaneously provided by a diffusion of the one conductivity type and the collector contacts and emitter to be simultaneously provided by another diffusion of the other conductivity type. Furthermore, by utilizing silicon having a particular crystallographic orientation and an anisotropic etch, shallow collector contacting diffusions and isolation diffusions are performed which create relatively little out diffusion of other regions as compared to prior art processes requiring deep isolation and collector contact diffusions. Thus, the above process obviates the initial steps of providing deep isolation and deep collector buried layer contacting diffusions employed in making some prior art integrated circuit transistors. Moreover the above process eliminates extra steps which always can possibly create problems because of mask defects, etc.

Figure 20:
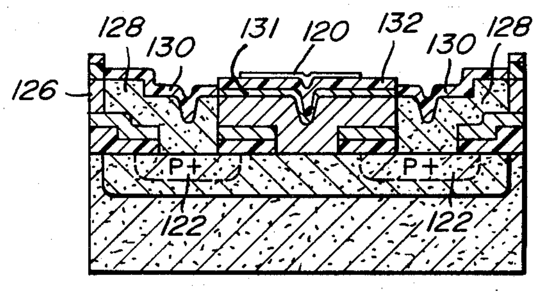
Figure 21:
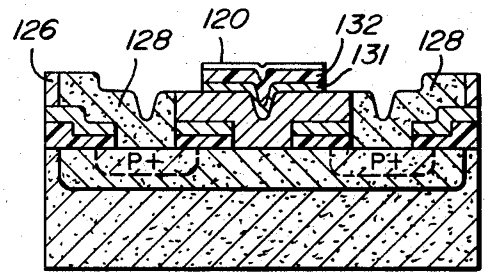

The process of the invention can also be employed to form a transistor having polycrystalline silicon contacts making conductive connection to the base enhancement regions. More specifically, the semiconductor structure of FIG. 8 can be masked to provide a starting structure which can be processed to form the structure shown in FIG. 20. P+ base enhancement regions 122 are formed through the exposed surfaces of polycrystalline silicon layer 126 by a boron diffusion to thereby form heavily P+ doped base enhancement contacts 128 therein which have sufficient impurity concentration to operate as an etch stop. Surface silicon dioxide layer 130 is formed as a by-product of the diffusion. Then an etch resistive mask 120 is developed by known photolithographic and etch techniques over the portion of polycrystalline silicon layer 126 which will become the emitter contact. This is done by a relatively non-critical alignment as compared to what is usually necessary per prior art techniques to form the emitter opening. After a dip etch removes all of the surface silicon dioxide except that covered by etch resistant mask 120, then a nitride dip etch removes exposed portions of silicon nitride layer 131 including those portions previously extending over the portion of polycrystalline silicon layer 126 extending between P+ boron doped enhancement contacts 128 and the edge of etch resistant mask 120, as shown in FIG. 21. Hence the polycrystalline silicon intermediate the edge of mask 120 and contacts 128 is exposed.

Figure 22:
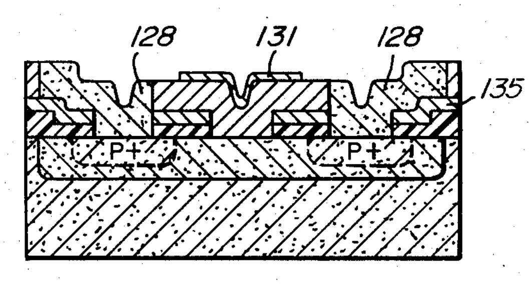
Figure 23:
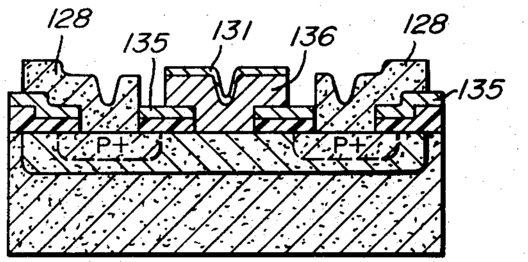

Next, etch resistant mask 120 and underlying surface silicon dioxide layer 132 are removed to expose underlying silicon nitride layer 131 as shown in FIG. 22. A potassium hydroxide etch is then applied which removes the polycrystalline silicon material beneath the areas intermediate the edge of silicon nitride layer 131 and the edges of doped enhancement contacts 128, as shown in FIG. 23. The P+ doped polycrystalline enhancement contacts 128 form an etch stop for the potassium hydroxide etch thus enabling it to sever the polycrystalline silicon layer to thereby expose thick silicon nitride layer 135. Silicon nitride 131 forms an etch mask for emitter contact 136.

Figure 24:
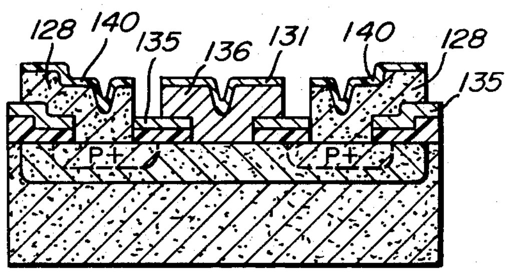
Figure 25:
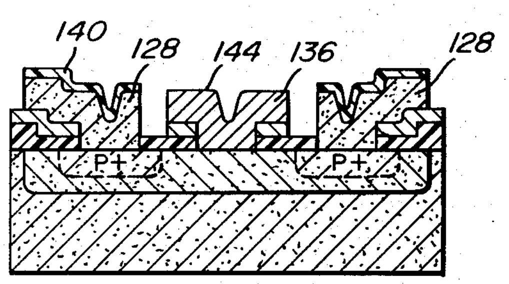
Figure 26:
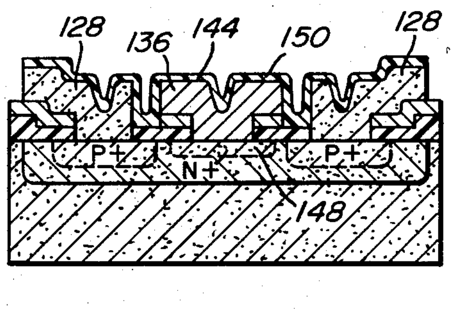

Then, as illustrated in FIG. 24, the doped polycrystalline silicon base contacts 128 are oxidized to form silicon dioxide 140 thereon. Nitride layers 131 and 135 don't oxidize. A silicon nitride dip etch removes emitter contact nitride 131 and the exposed nitride 135 between emitter contact 136 and base contacts 128. As a result, surface 144 of emitter contact 136 is exposed, as shown in FIG. 25. An N+ emitter diffusion is performed through exposed surface 144 and emitter contact 136 to form emitter 148, shown in FIG. 26. Silicon dioxide 150 is formed on surfaces 144 as a byproduct of the emitter diffusion. Either additional silicon dioxide is grown on the surface of the device of FIG. 26 or silicon dioxide layer 150 is formed into a pre-ohmic mask. Next, metallization is applied and patterned in known manners to complete the chip. As will be apparent to one skilled in the art, the above steps can be rearranged and still provide the desired result. In particular, mask 120 could be removed immediately after silicon dioxide 132 is patterned rather than after nitride 131 is patterned. Also, patterned silicon dioxide 132 can be removed anytime before oxide is formed on the polycrystalline silicon base contacts so that the desired nitride is exposed during the oxidation.

What has been immediately described, therefore, is a method of manufacturing discrete transistors having polycrystalline silicon contacts making conductive connection to base enhancement regions and the emitter regions which are diffused therethrough. Because they are performed through polycrystalline contacts, the emitter and base enhancement diffusions create less surface distortion of the monocrystalline silicon lattice and thereby result in transistors having improved electrical characteristics, as have been previously described. Moreover, the polycrystalline silicon contacts provide much larger surface areas to which preohmic, metallization and other masks can be aligned, thereby facilitating the manufacture of smaller geometry transistors which have maximized power gain bandwidths.

The immediately foregoing process can also be utilized to provide integrated circuit transistors in a substrate already having a buried layer, deep buried layer collector contacting diffusions and deep isolation diffusions. Alternatively, the above process can be combined with the foregoing process described with respect to FIGS. 13 through 19 to provide an integrated circuit transistor having emitter, base and collector polycrystalline silicon caps along with shallow enhancement and shallow collector buried layer contacting diffusions.

What is claimed is:

1. A process for forming a silicon semiconductor device having a first region of one conductivity type, a closely spaced second region of another conductivity type and a contact to the second region, which are all self-aligned with each other, to facilitate the manufacture of an electrical device having a small geometry in semiconductor material with a surface, the process comprising:

forming a first mask on the surface of the semiconductor material, said first mask having at least a first opening which exposes a selected area of the surface of the semiconductor material through which diffusant forming the first region is to enter and a second opening through which diffusant forming the second region is to enter, said step of forming said first mask includes the steps of forming a first silicon dioxide layer and a first silicon nitride layer, one on top of the other;

forming polycrystalline silicon contacting material in at least said second opening and on said first mask;

forming a second mask overlying said contacting material in said second opening;

diffusing first diffusant through said first opening of said first mask to form the first region of the one conductivity type, said second mask preventing said first diffusant from entering said semiconductor material through said second opening; and closing said first opening in said first mask and removing said second mask from said second opening and diffusing second diffusant through said contacting material and said second opening and into said semiconductor material to form said second region of the other conductivity type and the contact therefor, said first mask preventing the second diffusant from otherwise entering the semiconductor material.

2. The process of claim 1 wherein said step of forming the contacting material in said second opening includes depositing a layer of polycrystalline silicon over said first mask and in said first and second openings in said first mask.

3. A process for forming a silicon semiconductor transistor device having an emitter contact, base enhancement regions and an emitter region which are all aligned with each other to provide a transistor in a semiconductor material having a base with a first surface and a collector formed therein, the process comprising:

forming a first mask on the first surface of the base, said first mask having openings which expose selected areas of the first surface of the base through which enhancement and emitter forming diffusions are to enter, said step of forming a first mask on the first surface of the base including:

applying a first layer of silicon dioxide on the first surface of the base;

forming a first layer of silicon nitride on said first layer of silicon dioxide;

forming a second layer of silicon dioxide on said first layer of silicon nitride;

patterning said second layer of silicon dioxide including the removal of portions of said second layer of silicon dioxide to form an etch mask for said first layer of silicon nitride;
etching said first layer of silicon nitride to form an etch layer for said first layer of silicon dioxide; and
etching said first layer of silicon dioxide;
forming a polycrystalline silicon emitter contact in said emitter opening provided in said first mask;
forming a second mask only on the emitter contact;
diffusing the enhancement regions through said first surfaces of said base exposed by said enhancement openings, said first mask and said second mask preventing the enhancement diffusants from otherwise entering the semiconductor material;
closing said enhancement openings in said first mask by forming diffusant resistant material therein;
removing said second mask from over said emitter contact; and
diffusing said emitter through the emitter contact and into said base, said first mask and said diffusant resistant material formed in said enhancement openings preventing said emitter diffusant from otherwise entering the semiconductor material.

4. The process of claim 3 wherein said step of forming the emitter contact in said emitter opening provided in said first mask includes:
forming a layer of polycrystalline silicon in said openings of said first mask and on said first mask;
providing a second layer of silicon nitride on said polycrystalline silicon layer;
providing a third layer of silicon dioxide on said second layer of silicon nitride;
etching said third layer of silicon dioxide to form an etch mask for said second layer of silicon nitride, said first layer of silicon nitride protecting said first layer of silicon dioxide during said etch of said third layer of silicon dioxide and said second layer of silicon nitride forming an etch stop;
etching said second layer of silicon nitride to complete a mask for said polycrystalline silicon layer; and
etching said polycrystalline silicon layer to form said emitter contact.

5. The process of claim 3 wherein said step of closing said enhancement openings in said first mask by forming diffusant resistant material therein includes providing a layer of silicon dioxide in said enhancement openings.

6. A process for forming a silicon semiconductor transistor device having self-aligned base enhancement and emitter regions, isolation junctions, and collector and emitter contacts for semiconductor material having a first surface, a predetermined crystallographic orientation, a collector and a buried layer, the process comprising:
forming a first mask on the first surface of the semiconductor material, said first mask having first openings which expose selected areas of the semiconductor material in which the collector contact and isolation junctions are to be provided;
anisotropically etching said exposed selected areas of the semiconductor material to remove some of the semiconductor material to provide collector and isolation grooves having sidewalls forming a predetermined included angle with the first surface of the semiconductor material, the etch rate of said anisotropic etch being substantially reduced when said sidewalls reach each other to form a point at a predetermined depth in the semiconductor material, said depth being controlled by said first mask openings;
simultaneously etching second openings through said first mask which expose areas of the semiconductor material through which self-aligned base enhancement and emitter diffusions can be performed;
providing the collector and emitter contacts respectively in said collector contact grooves and said emitter opening;
forming a second mask on said collector and emitter contacts;
simultaneously diffusing the enhancement regions and the isolation junctions through said enhancement openings and said isolation grooves, said first mask and said second mask preventing the diffusant from otherwise entering the semiconductor material;
closing said enhancement openings and said isolation junction grooves by forming diffusant resistant material therein;
removing said second mask from over said collector and emitter contacts; and
diffusing through said emitter and said collector contacts to form conductive connections with said collector and said emitter, said first mask and said diffusant resistant material preventing said collector contact and emitter diffusant from otherwise entering the semiconductor material.

7. The process of claim 6 wherein said step of anisotropically etching said exposed selected areas of the semiconductor material to form said grooves includes applying a potassium hydroxide etch reagent to the semiconductor material, which has a [100] crystallographic orientation.

8. The process of claim 6 wherein the step of providing the collector and emitter contacts respectively in said collector contact grooves and said emitter opening, comprises:
forming a polycrystalline silicon layer in said isolation and collector contact grooves and in said emitter and base enhancement openings and on said first mask;
forming an etch resistant mask over portions of said polycrystalline silicon layer which overlie the regions of the semiconductor material in which the collector contact and emitter diffusions are to be formed; and
removing said polycrystalline silicon material from said isolation grooves and said base enhancement openings.

9. The process of claim 6 wherein said step of closing said enhancement openings and said isolation junction grooves by forming diffusant-resistant material therein includes forming an additional layer of silicon dioxide therein.

10. A process for forming a silicon semiconductor transistor device having base enhancement and emitter regions each making conductive connection to larger polycrystalline silicon contacts which are all aligned with each other to provide a transistor in semiconductor material having a base with a first surface, and a collector already provided therein, the process comprising:

forming a first mask on the first surface of the base, said first mask having openings which expose selected areas of the base through which the emitter and base enhancement diffusions are to be provided, said step of forming said first mask includes the steps:

forming a first layer of silicon dioxide on the first surface of the base;

forming a first layer of silicon nitride on the first layer of silicon dioxide;

forming a second layer of silicon dioxide on the said first layer of silicon nitride;

etching said second layer of silicon dioxide to form an etch pattern for said underlying first layer of silicon nitride, said first layer of silicon nitride forming an etch stop for said etch of said second layer of silicon dioxide;

etching said silicon nitride to form an etch pattern for said first layer of said silicon dioxide, said first layer of silicon dioxide operating as an etch stop for said etch of said first layer of silicon nitride; and etching said first layer of silicon dioxide, said base forming an etch stop for said etch of said first layer of silicon dioxide;

providing a layer of polycrystalline silicon over said first mask and in said emitter and base enhancement openings;

forming a second mask over said polycrystalline silicon so that the surface thereof is exposed overlying the base areas wherein said enhancement diffusions are to be performed;

diffusing a boron material through said exposed surfaces of said polycrystalline silicon to transform it into an etch stoppant, and into the base to form the enhancement regions;

removing portions of said second mask between the opening through which the emitter is to be diffused and the openings through which the base enhancements were diffused to thereby expose the underlying polycrystalline silicon material;

etching the polycrystalline silicon material between the edge of the regions of the polycrystalline silicon which were doped by the base enhancement and the edge of the second mask overlying the opening through which the emitter will be diffused to thereby sever the polycrystalline silicon layer to shape the emitter and base contacts, said doped region of polycrystalline silicon material forming an etch stop to protect the base contacts and said second mask forming an etch protective layer to protect the emitter contact from said polycrystalline silicon etch;

providing a third mask over said base contacts;

removing said second mask from over said emitter contact; and diffusing through said emitter contact to form said emitter, said first and said third masks preventing said emitter diffusant from otherwise entering the semiconductor material.

11. The process of claim 10 wherein said step of forming a second mask over said polycrystalline silicon so that the surfaces thereof are exposed overlying the base areas where said enhancement diffusions are to be performed, includes the steps of forming a second layer of silicon nitride on said polycrystalline silicon;

forming a third layer of silicon dioxide on said second layer of silicon nitride;

selectively etching said third layer of silicon dioxide to provide an etch mask for said second layer of silicon nitride, said first layer of silicon nitride protecting said first layer of silicon dioxide during said etch of said third layer of silicon dioxide; and etching said second layer of silicon nitride to complete said second mask.

12. The process of claim 10 wherein said step of removing said second mask between the opening through which the emitter is to be diffused and the opening through which the base enhancements were diffused to thereby expose the underlying polycrystalline silicon material includes the step of providing an etch resistant mask on top of said third silicon dioxide layer.

* * * * *